United States Patent
Yu et al.

(10) Patent No.: US 10,490,674 B2
(45) Date of Patent: Nov. 26, 2019

(54) SEMICONDUCTOR DEVICE AND MANUFACTURING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Guo Bin Yu, Shanghai (CN); Xiao Ping Xu, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 31 days.

(21) Appl. No.: 15/821,349

(22) Filed: Nov. 22, 2017

(65) Prior Publication Data

US 2018/0145182 A1   May 24, 2018

(30) Foreign Application Priority Data

Nov. 24, 2016 (CN) .......................... 2016 1 1048954

(51) Int. Cl.
*H01L 29/51* (2006.01)
*H01L 29/66* (2006.01)
(Continued)

(52) U.S. Cl.
CPC ...... *H01L 29/7883* (2013.01); *H01L 21/0214* (2013.01); *H01L 21/0223* (2013.01);
(Continued)

(58) Field of Classification Search
CPC ............. H01L 29/7883; H01L 29/0649; H01L 29/42324; H01L 29/42364; H01L 29/513;
(Continued)

(56) References Cited

U.S. PATENT DOCUMENTS 6,855,627 B1   2/2005 Dakshina-Murthy et al.
2003/0008526 A1   1/2003 Gambino et al.
(Continued)

FOREIGN PATENT DOCUMENTS

EP   3182444 A1   6/2016
JP   2008-16499 A   1/2008

OTHER PUBLICATIONS

Machine Translation JP 2008-016499.*
European Search Report, EP17202874, dated Mar. 16, 2018, 1 page.

*Primary Examiner* — Patricia D Reddington
(74) *Attorney, Agent, or Firm* — Innovation Counsel LLP

(57) ABSTRACT

A semiconductor device and its manufacturing method are presented. The manufacturing method entails: providing a semiconductor substrate, wherein the semiconductor substrate comprises a first region and a second region that are mutually exclusive from one another, with a first oxide layer on the first and the second regions; conducting a nitriding process on the semiconductor substrate to form a nitride barrier layer on the first oxide layer on the first and the second regions; removing the first oxide layer on the second region; and conducting an oxidation process to form a second oxide layer on the second region.

12 Claims, 3 Drawing Sheets

(51) Int. Cl.
*H01L 29/78* (2006.01)
*H01L 29/788* (2006.01)
*H01L 21/02* (2006.01)
*H01L 21/027* (2006.01)
*H01L 21/28* (2006.01)
*H01L 27/11521* (2017.01)
*H01L 27/11531* (2017.01)
*H01L 29/06* (2006.01)
*H01L 29/423* (2006.01)
*H01L 21/8234* (2006.01)
*H01L 21/8238* (2006.01)

(52) U.S. Cl.
CPC .... *H01L 21/0273* (2013.01); *H01L 21/02238* (2013.01); *H01L 21/02247* (2013.01); *H01L 21/02252* (2013.01); *H01L 21/02332* (2013.01); *H01L 21/28273* (2013.01); *H01L 21/823462* (2013.01); *H01L 21/823857* (2013.01); *H01L 27/11521* (2013.01); *H01L 27/11531* (2013.01); *H01L 29/0649* (2013.01); *H01L 29/42324* (2013.01); *H01L 29/42364* (2013.01); *H01L 29/513* (2013.01); *H01L 29/518* (2013.01); *H01L 29/66825* (2013.01); *H01L 29/66636* (2013.01); *H01L 29/7848* (2013.01)

(58) Field of Classification Search
CPC ............. H01L 29/518; H01L 29/66825; H01L 21/0214; H01L 21/0223; H01L 21/02238; H01L 21/02247; H01L 21/02252; H01L 21/02332; H01L 21/0273; H01L 21/28273; H01L 21/823462; H01L 21/823857; H01L 27/11521; H01L 27/11531; H01L 29/66636; H01L 29/7848
USPC ........................................................ 257/321
See application file for complete search history.

(56) References Cited

U.S. PATENT DOCUMENTS

| | | | |
|---|---|---|---|
| 2005/0003618 A1* | 1/2005 | Kanda | H01L 21/823462 438/275 |
| 2010/0243046 A1* | 9/2010 | Degroot | H01L 31/02167 136/256 |
| 2011/0003467 A1* | 1/2011 | Kanda | H01L 21/02236 438/585 |
| 2012/0018791 A1* | 1/2012 | Zhu | H01L 21/28273 257/316 |

* cited by examiner

SEMICONDUCTOR DEVICE AND MANUFACTURING METHOD THEREOF

CROSS-REFERENCE TO RELATED APPLICATION

This application claims priority to and benefit of Chinese Patent Application No. 201611048954.5 filed on Nov. 24, 2016, which is incorporated herein by reference in its entirety.

BACKGROUND (a) Field of the Invention

This inventive concept relates to semiconductor technology, more specifically, a semiconductor device and its manufacturing method.

(b) Description of the Related Art

NOR flash memory has been widely used in embedded systems to read and write programs. Compared to NAND flash memory, NOR flash memory provides better performance on data reading and writing, and supports in-chip data processing with eXecute-In-Place (XIP).

However, as the density of memory units in a NOR flash memory increases, the thickness of a tunnel oxide layer in the NOR flash memory may go out-of-spec in some regions, which in turn increases a threshold voltage of the NOR flash memory in those regions.

SUMMARY

This inventive concept presents a semiconductor manufacturing method that can prevent the thickness of an oxide layer from getting out-of-spec in designated areas.

This semiconductor manufacturing method comprises:

providing a semiconductor substrate, wherein the semiconductor substrate comprises a first region and a second region that are mutually exclusive from one another, with a first oxide layer on the first and the second regions;

conducting a nitriding process to form a nitride barrier layer on the first oxide layer on the first and the second regions;

removing the nitride barrier layer and the first oxide layer on the second region; and conducting an oxidation process to form a second oxide layer on the second region.

Additionally, in the aforementioned method, the semiconductor substrate may further comprise:

a third region different from the first region and the second region; and a third oxide layer on the third region, wherein the thickness of the third oxide layer is larger than the thickness of the second oxide layer, and wherein the nitriding process also forms a nitride barrier layer on the third oxide layer.

Additionally, in the aforementioned method, providing a semiconductor substrate may comprise:

providing the semiconductor substrate comprising the first region, the second region and the third region that are mutually exclusive from one another;

forming the third oxide layer on the first region, the second region and the third region;

removing the third oxide layer on the first and the second regions; and forming the first oxide layer on the first and the second regions.

Additionally, in the aforementioned method, conducting a nitriding process may comprise:

conducting a Decouple Plasma Nitriding (DPN) process; and conducting a Post-Nitriding Annealing (PNA) process.

Additionally, in the aforementioned method, removing the nitride barrier layer on the second region and the first oxide layer on the second region may comprise:

forming a photomask layer on the semiconductor substrate;

patternizing the photomask layer to expose the nitride barrier layer on the second region and the first oxide layer on the second region; and removing the nitride barrier layer on the second region and the first oxide layer on the second region.

Additionally, in the aforementioned method, the photomask layer may comprise:

a protection layer to prevent photoresist poisoning; and a photoresist on the protection layer, and the aforementioned method may further comprise:

removing the remaining photomask layer; or removing the photoresist of the remaining photomask layer while retaining the protection layer of the remaining photomask layer.

Additionally, in the aforementioned method, the protection layer may be made of silicon oxide, amorphous carbon, or poly-silicon.

Additionally, in the aforementioned method, a nitrogen dose in the nitriding process may be from $5\times10^{15}$ atoms/cm$^2$ to $2\times10^{16}$ atoms/cm$^2$.

Additionally, in the aforementioned method, the nitride barrier layer may be made of silicon oxynitride (SiON).

Additionally, in the aforementioned method, the thickness of the nitride barrier layer may be from 3 Angstrom to 50 Angstrom.

Additionally, in the aforementioned method, the first oxide layer may be a tunnel oxide layer for a flash memory device.

Additionally, the aforementioned method may further comprise forming a floating gate and a control gate on the nitride barrier layer on the first region.

This inventive concept further presents a semiconductor device, comprising:

a semiconductor substrate, comprising a first region and a second region that are mutually exclusive from one another;

a first oxide layer on the first region;

a nitride barrier layer on the first oxide layer; and a second oxide layer on the second region.

Additionally, in the aforementioned device, the semiconductor substrate may further comprise:

a third region that is different from the first region and the second region, and the aforementioned device may further comprise a third oxide layer on the third region, wherein the nitride barrier layer covers the third oxide layer, and the thickness of the third oxide layer is larger than the thickness of the second oxide layer.

Additionally, the aforementioned device may further comprise a protection layer on the nitride barrier layer to prevent photoresist poisoning.

Additionally, in the aforementioned device, the protection layer may be made of silicon oxide, amorphous carbon, or poly-silicon.

Additionally, in the aforementioned device, the nitride barrier layer may be made of silicon oxynitride (SiON).

Additionally, in the aforementioned device, the thickness of the nitride barrier layer may be from 3 Angstrom to 50 Angstrom.

Additionally, in the aforementioned device, the first oxide layer may be a tunnel oxide layer for a flash memory device.

Additionally, the aforementioned device may further comprise a floating gate and a control gate on the nitride barrier layer.

BRIEF DESCRIPTION OF THE DRAWINGS

The drawings illustrate some embodiments of this inventive concept and will be used to describe this inventive concept along with the specification.

DETAILED DESCRIPTION OF THE EMBODIMENTS

Figure 1:
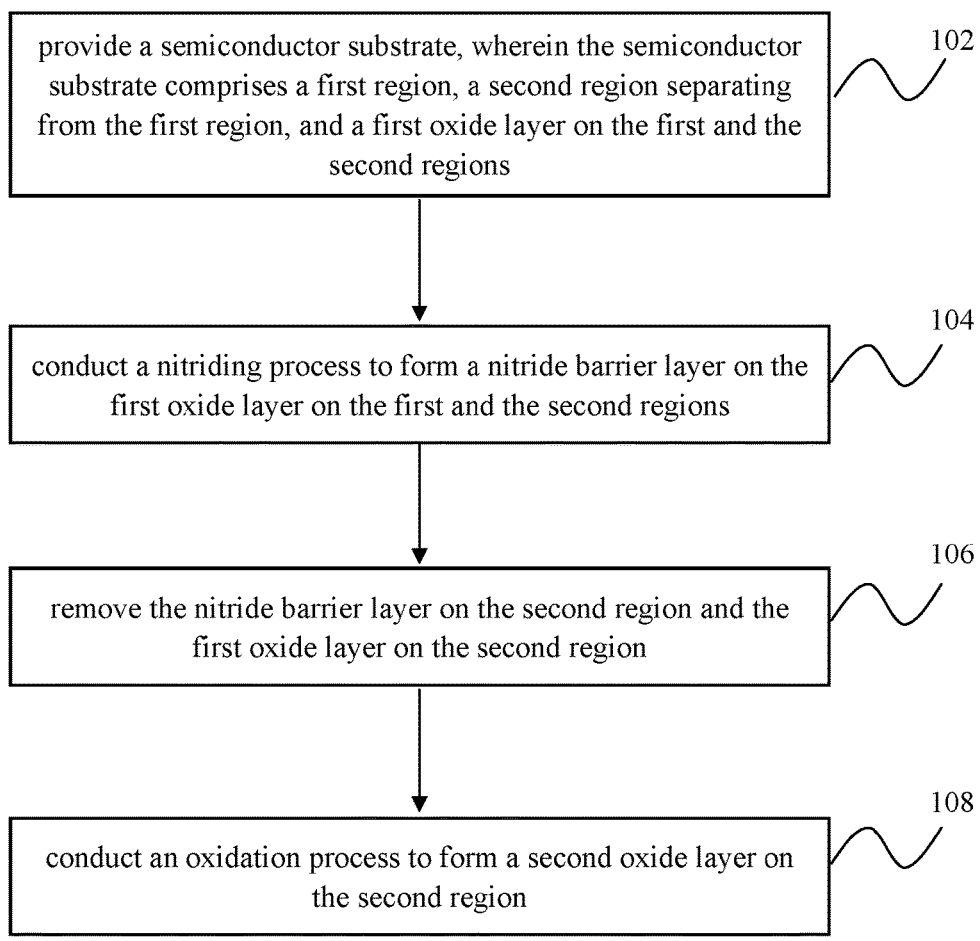
FIG. 1 shows a flowchart illustrating a semiconductor device manufacturing method in accordance with one or more embodiments of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated programmable hardware circuits (such as electrical, mechanical, and/or optical circuits) adapted for the various operations pertaining to embodiments of the inventive concept.

In the manufacture of semiconductor devices, different devices, such as High Voltage device, Low Voltage device, and flash memory, may need to be manufactured simultaneously on a substrate. Therefore, after a tunnel oxide layer for a flash memory is formed on a substrate, additional processes may be needed to form oxide layers for other devices, these additional processes may incidentally thicken the tunnel oxide layer for the flash memory and thus increase its threshold voltage. A semiconductor device manufacturing method remedying this situation is described below.

FIG. 1 shows a flowchart illustrating a semiconductor device manufacturing method in accordance with one or more embodiments of this inventive concept. FIGS. 2, 3, 4, and 5 show schematic sectional views illustrating different stages of a semiconductor device manufacturing method in accordance with one or more embodiments of this inventive concept. Referring to these figures, a semiconductor device manufacturing method in accordance with one or more embodiments of this inventive concept will be described below.

Figure 2:
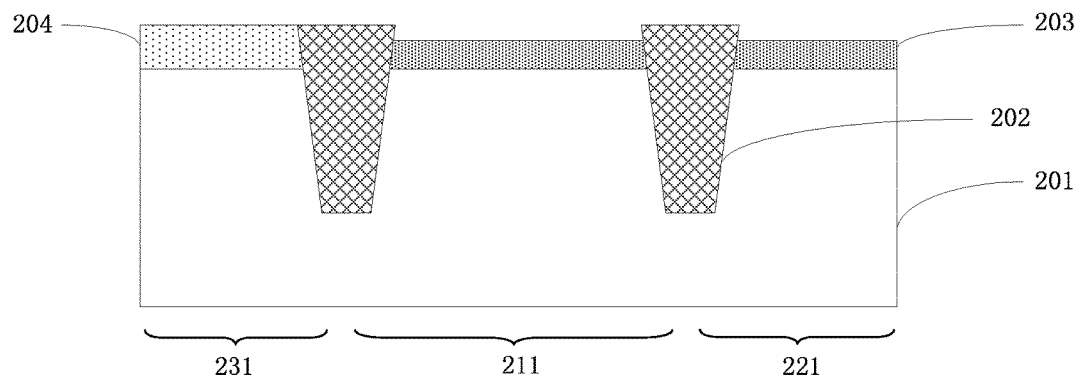
FIGS. 2, 3, 4, and 5 show schematic sectional views illustrating different stages of a semiconductor device manufacturing method in accordance with one or more embodiments of this inventive concept.

In step 102, a semiconductor substrate 201 is provided. Referring to FIG. 2, the semiconductor substrate 201 may comprise a first region 211 and a second region 221 that are mutually exclusive from one another, with a first oxide layer 203 is formed on the first region 211 and the second region 221. The first region 211 and the second region 221 may be separated by a separation structure 202, which can be a Shallow Trench Isolation (STI) structure.

In one embodiment, the semiconductor substrate 201 may further comprise a third region 231 different from the first region 211 and the second region 221, and a third oxide layer 204 on the third region 231. Here, the first region 211 is a region for a flash memory device, the second region 221 and the third region 231 are regions for a Low Voltage device and a High Voltage device, respectively. It is understood that low/high voltage of a device refers to its threshold voltage, with the threshold voltage of a Low Voltage device lower than the threshold voltage of a High Voltage device. In one embodiment, the first oxide layer 203 is a tunnel oxide layer for a flash memory device such as a NOR flash memory, and the third oxide layer 204 is an oxide layer for a High Voltage device.

In one embodiment, the structure of FIG. 2 can be formed by the following process. First, the semiconductor substrate 201 is provided, wherein the semiconductor substrate 201 comprises the first region 211, the second region 221, and the third region 231 that are mutually exclusive of one another. The third oxide layer 204 is formed on the first region 211, the second region 221, and the third region 231 through an oxidation process, then the third oxide layer 204 on the first region 211 and the second region 221 is removed while the third oxide layer 204 on the third region 231 remains. Then a first oxide layer 203 is formed on the first region 211 and the second region 221 through an oxidation process, resulting in the structure of FIG. 2.

Figure 3:
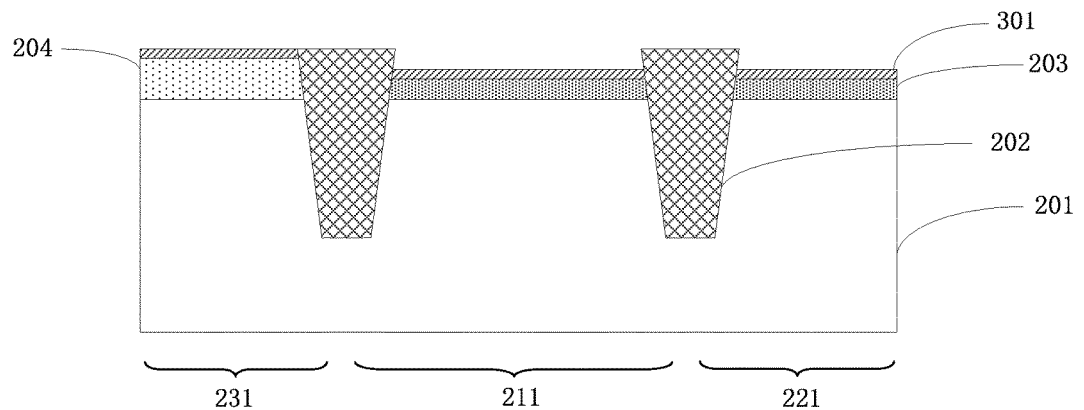

In step 104, a nitride barrier layer 301 is formed on the first oxide layer 203 on the first region 211 and the second region 221 through a nitriding process, as shown in FIG. 3. The nitride barrier layer 301 may be made of silicon oxynitride (SiON). If the semiconductor substrate 201 comprises the third region 231, the nitride barrier layer 301 is also formed on the third oxide layer 204 on the third region 231.

In one embodiment, the nitriding process comprises two steps: conducting a Decouple Plasma Nitriding (DPN) process; and conducting a Post-Nitriding Annealing (PNA) process. In one embodiment, a nitrogen dose in the nitriding process can be from $5 \times 10^{15}$ atoms/cm$^2$ to $2 \times 10^{16}$ atoms/cm$^2$. For example, it can be $7 \times 10^{15}$ atoms/cm$^2$, $9 \times 10^{15}$ atoms/cm$^2$, or $1 \times 10^{16}$ atoms/cm$^2$. The nitride barrier layer 301 may be formed on the first oxide layer 203 through the DPN and PNA processes. Optimally, the thickness of the nitride barrier layer 301 may be from 3 Angstrom to 50 Angstrom. For example, it can be 10 Angstrom, 30 Angstrom, or 40 Angstrom.

Figure 4:
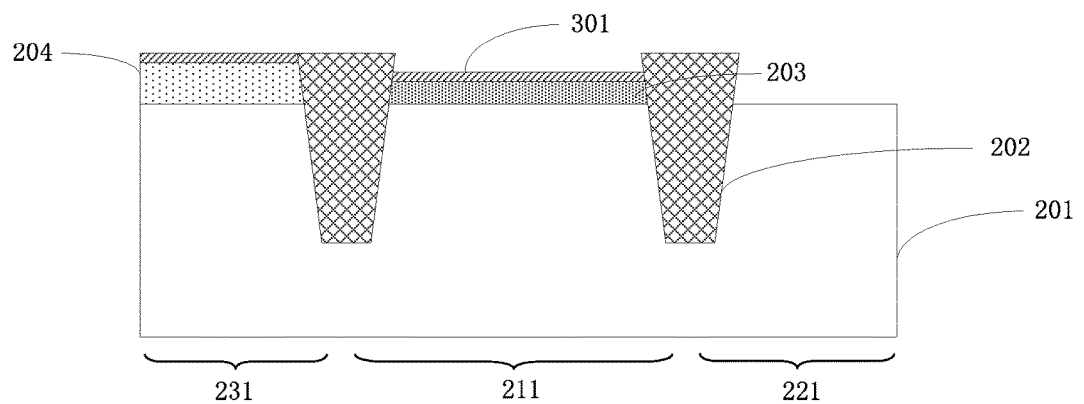

In step 106, after the nitriding process, the nitride barrier layer 301 on the second region 221 and the first oxide layer 203 on the second region 221 are both removed, as shown in FIG. 4.

In one embodiment, the nitride barrier layer 301 on the second region 221 and the first oxide layer 203 on the second region 221 may be removed by the following process. First, after the nitriding process, a photomask layer is formed on the semiconductor substrate 201. In one embodiment, the photomask layer may comprise a photoresist. In another embodiment, the photomask layer may comprise a protection layer to prevent photoresist poisoning and a photoresist on the protection layer. The protection layer protects the photoresist from contacting the nitride barrier layer 301 to cause photoresist poisoning. Optimally, the protection layer may be made of silicon oxide, amorphous carbon, or polysilicon. As an example, Atomic Layer Deposition (ALD), Chemical Vapor Deposition (CVD), or furnace oxidation may be used to form the protection layer. Then, the photomask layer is patterned to expose the nitride barrier layer 301 on the second region 221 and the first oxide layer 203 on the second region 221, the exposed nitride barrier layer 301 on the second region 221 and the first oxide layer 203 are then removed. The remaining photomask layer may also be removed afterwards. Alternately, the photoresist of the remaining photomask layer is removed while the protection layer of the remaining photomask layer is retained.

Figure 5:
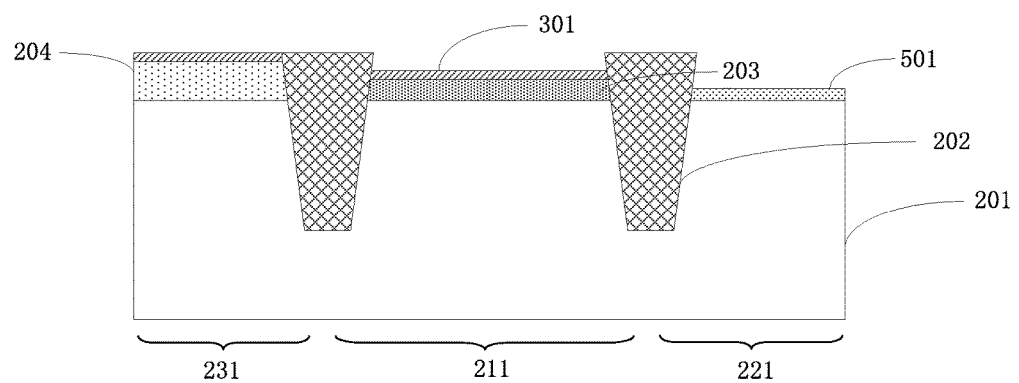

In step 108, an oxidation process is conducted to form a second oxide layer 501 on the second region 221, as shown in FIG. 5. The second oxide layer 501 is for a Low Voltage device, and the thickness of the second oxide layer 501 is less than the thickness of the third oxide layer 204.

This concludes the description of a semiconductor device manufacturing method in accordance with one or more embodiments of this inventive concept. In this manufacturing method, a nitride barrier layer is formed on the first oxide layer on the first region. During the oxidation process on the second oxide layer on the second region, the nitride barrier layer prevents oxygen from contacting the first oxide layer on the first region, and thus prevents the first oxide layer on the first region from being incidentally thickened by the oxidation process to affect the threshold voltage of the device (such as a flash memory) formed in this region.

It is understood that although the first oxide layer in this inventive concept is a tunnel oxide layer for a flash memory device, it is not limited herein. The manufacturing method of this inventive concept can apply to not only a flash memory device, but also other devices that suffer similar manufacturing problems.

After these processes, a flash memory may be manufactured on the resulting structure by existing processes. For example, a floating gate and a control gate may be formed on the nitride barrier layer on the first region, a Low Voltage device may be formed on the second oxide layer on the second region, and a High Voltage device may be formed on the third oxide layer on the third region. The Low Voltage device and the High Voltage device can both be a logic device. Manufacturing process afterwards is not within the scope of this inventive concept, and therefore is omitted for conciseness.

This inventive concept further presents a semiconductor device. Referring to FIG. 5, this semiconductor device comprises a semiconductor substrate 201, which comprises a first region 211 and a second region 221 that are mutually exclusive from one another. The first region 211 and the second region 221 may be partially separated by a separation structure 202 between them, which can be a Shallow Trench Isolation (STI) structure.

The semiconductor device may further comprise a first oxide layer 203 on the first region 211 and a nitride barrier layer 301 on the first oxide layer 203, the nitride barrier layer 301 may be made of silicon oxynitride (SiON). Optimally, the thickness of the nitride barrier layer 301 may be from 3 Angstrom to 50 Angstrom. For example, it can be 10 Angstrom, 30 Angstrom, or 40 Angstrom. In one embodiment, the first oxide layer 203 is a tunnel oxide layer for a flash memory device. The semiconductor device may further comprise a second oxide layer 501 on the second region 221.

Referring to FIG. 5, in one embodiment, the semiconductor device may further comprise a third region 231 different from the first region 211 and the second region 221. In this embodiment, the semiconductor device may further comprise a third oxide layer 204 on the third region 231, and the nitride barrier layer 301 may also cover the third oxide layer 204. The thickness of the third oxide layer 204 is larger than the thickness of the second oxide layer 501.

In one embodiment, the semiconductor device may further comprise a protection layer (not shown in FIG. 5) on the nitride barrier layer 301 to prevent photoresist poisoning, the protection layer may be made of silicon oxide, amorphous carbon, or poly-silicon.

In another embodiment, the semiconductor device may further comprise a floating gate and a control gate (not shown in FIG. 5) on the nitride barrier layer 301 on the first region 211.

This concludes the description of a semiconductor device and its manufacturing method in accordance with one or more embodiments of this inventive concept. While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device manufacturing method, comprising:
   providing a semiconductor substrate, wherein the semiconductor substrate comprises a first region and a second region that are mutually exclusive from one another and separated by a separation structure, with a first oxide layer on the first and the second regions;
   conducting a nitriding process to form a nitride barrier layer on the first oxide layer on the first and the second regions;
   removing the nitride barrier layer and the first oxide layer only on the second region, with the nitride barrier layer and the first oxide layer on the first region retained; and
   conducting an oxidation process to form a second oxide layer only on the second region, wherein a thickness of the second oxide layer is less than a thickness of the first oxide layer.

2. The method of claim 1, wherein the semiconductor substrate further comprises:
   a third region different from the first region and the second region; and
   a third oxide layer on the third region, wherein the thickness of the third oxide layer is larger than the thickness of the second oxide layer,
   and wherein the nitriding process also forms a nitride barrier layer on the third oxide layer.

3. The method of claim 2, wherein providing a semiconductor substrate comprises:
   providing the semiconductor substrate comprising the first region, the second region and the third region that are mutually exclusive from one another;
   forming the third oxide layer on the first region, the second region and the third region;
   removing the third oxide layer on the first and the second regions; and
   forming the first oxide layer on the first and the second regions.

4. The method of claim 1, wherein conducting a nitriding process comprises:
   conducting a Decouple Plasma Nitriding (DPN) process; and
   conducting a Post-Nitriding Annealing (PNA) process.

5. The method of claim 1, wherein removing the nitride barrier layer on the second region and the first oxide layer on the second region comprises:
   forming a photomask layer on the semiconductor substrate;
   patterning the photomask layer to expose the nitride barrier layer on the second region and the first oxide layer on the second region; and
   removing the nitride barrier layer on the second region and the first oxide layer on the second region.

6. The method of claim 5, wherein the photomask layer comprises:
   a protection layer to prevent photoresist poisoning; and
   a photoresist on the protection layer,
   and wherein the method of claim 5 further comprises:
   removing the remaining photomask layer; or
   removing the photoresist of the remaining photomask layer while retaining the protection layer of the remaining photomask layer.

7. The method of claim 6, wherein the protection layer is made of silicon oxide, amorphous carbon, or poly-silicon.

8. The method of claim 1, wherein a nitrogen dose in the nitriding process is from $5*10^{15}$ atoms/cm$^2$ to $2*10^{16}$ atoms/cm$^2$.

9. The method of claim 1, wherein the nitride barrier layer is made of silicon oxynitride (SiON).

10. The method of claim 1, wherein the thickness of the nitride barrier layer is from 3 Angstrom to 50 Angstrom.

11. The method of claim 1, wherein the first oxide layer is a tunnel oxide layer for a flash memory device.

12. The method of claim 1, further comprises:
   forming a floating gate and a control gate on the nitride barrier layer on the first region.

\* \* \* \* \*